United States Patent [19]

Fuoco et al.

[11] Patent Number: 5,021,732
[45] Date of Patent: Jun. 4, 1991

[54] BURN-IN TESTING EQUIPMENT HAVING AN INSTRUMENTATION CONTROL MODULE

[75] Inventors: Francis J. Fuoco, Commack; Anthony Linardos, Copaigue, both of N.Y.

[73] Assignee: Grumman Aerospace Corporation, Bethpage, N.Y.

[21] Appl. No.: 443,825

[22] Filed: Dec. 1, 1989

Related U.S. Application Data

[63] Continuation of Ser. No. 263,219, Oct. 27, 1988, abandoned.

[51] Int. Cl.$^5$ ............................................. G01R 31/02
[52] U.S. Cl. .............................. 324/158 F; 324/158 R; 361/394
[58] Field of Search ............ 324/158 P, 158 F, 158 R; 361/412, 413, 415, 394, 399

[56] References Cited

U.S. PATENT DOCUMENTS

| | | | |
|---|---|---|---|
| 4,328,676 | 5/1982 | Reed | 62/3 |
| 4,426,619 | 1/1984 | Demand | 324/158 F |
| 4,542,341 | 9/1985 | Santomango et al. | 324/73 R |
| 4,695,707 | 9/1987 | Young | 324/158 F |
| 4,724,377 | 2/1988 | Maelzer et al. | 324/158 R |
| 4,729,246 | 3/1988 | Melgaard et al. | 374/57 |

OTHER PUBLICATIONS

Bruder et al., "Carrier Card for Component Aging", IBM Technical Disclosure Bulletin, vol. 14, No. 3, 8/71, p. 737.

Primary Examiner—Reinhard J. Eisenzopf
Assistant Examiner—Edward Urban
Attorney, Agent, or Firm—Pollock, Vande Sande & Priddy

[57] ABSTRACT

To provide for portability in the stress testing of electronic components in a high temperature environment, an instrumentation control module having an enclosure for containing the driver electronics which generates signals for operating the electronic components for stress testing may be used. The control module, in particular, has an enclosure for containing a driver card, which has either mounted thereon or integrated thereto the electronics necessary to drive the electronic components, mounted onto a carrier card which is mated to the driver card, by means of connectors, also residing within the enclosure, so as to avoid being exposed to the heat in the high temperature environment. To further insure that no heat would escape from the high temperature environment into the enclosure, a seal gasket is attached to the outside of the enclosure, at the opening where the carrier card is extended from the enclosure and mated with the connector therein. By incorporating a programmable bar code display into the enclosure, the control module truly achieves portability as the same may be independently monitored.

16 Claims, 2 Drawing Sheets

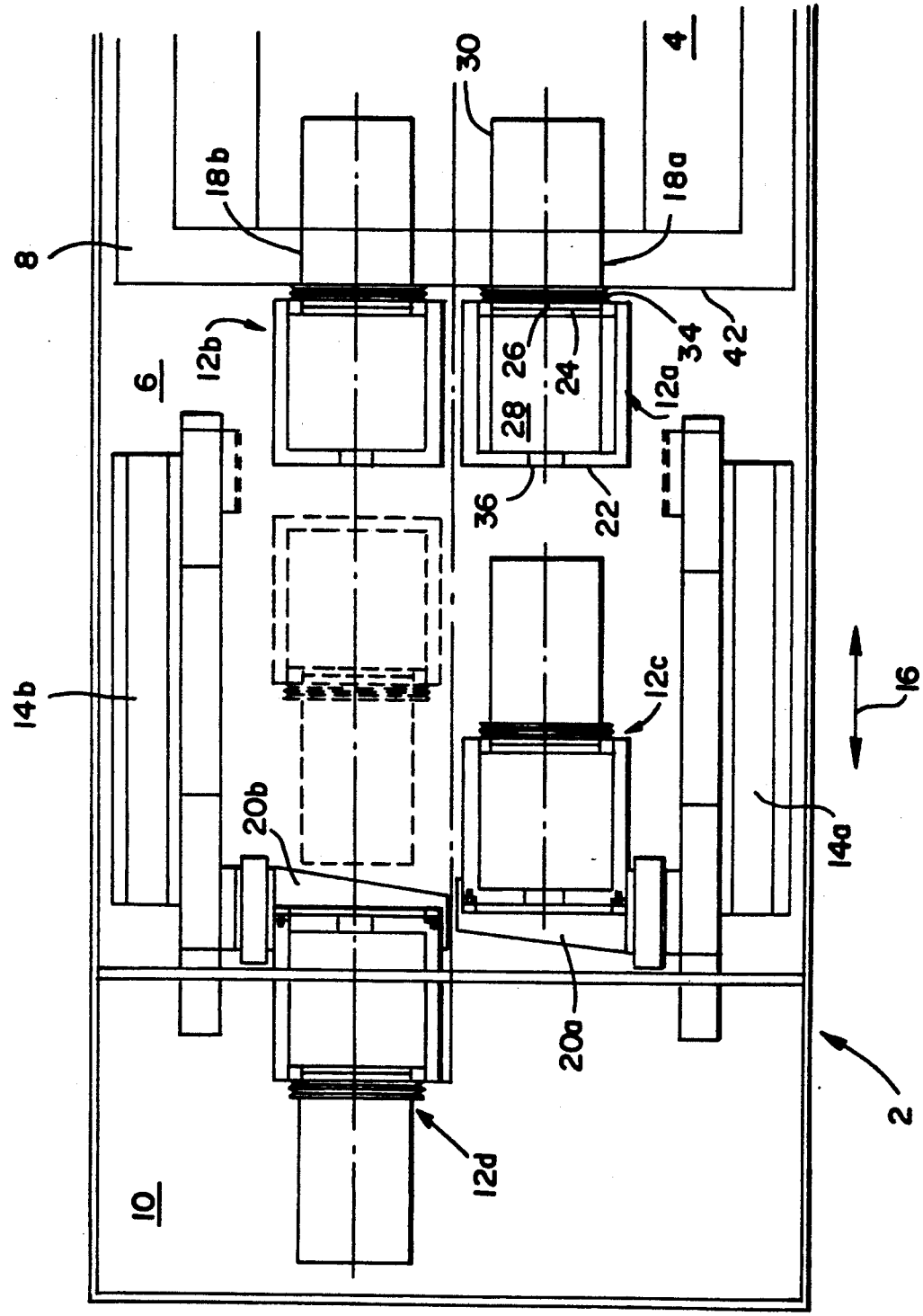

FIG. 2(a)
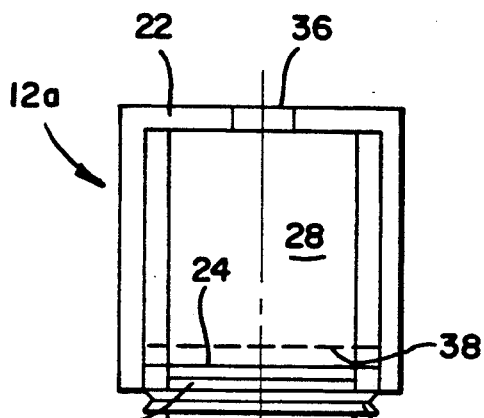
FIG. 2(b)
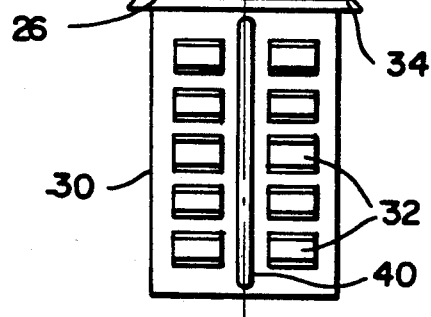
FIG. 3(b)
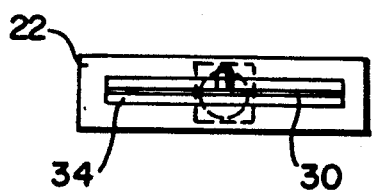
FIG. 4
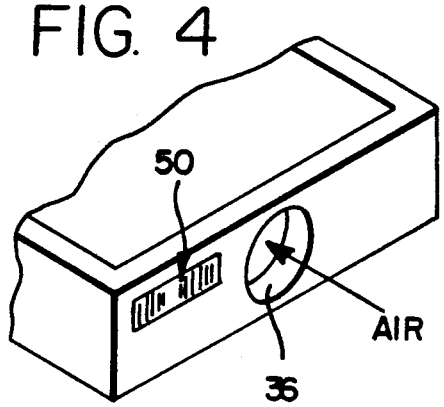
FIG. 3(a)
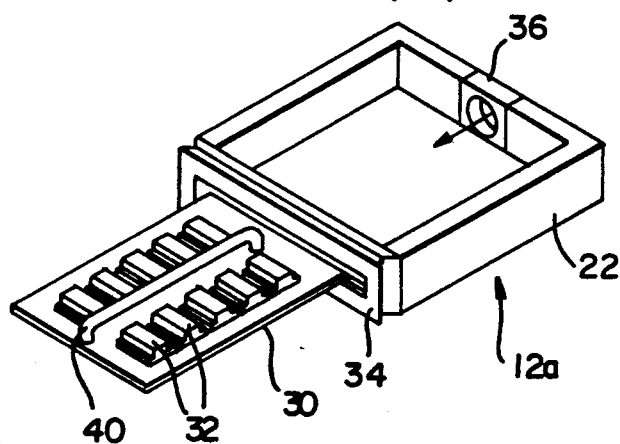
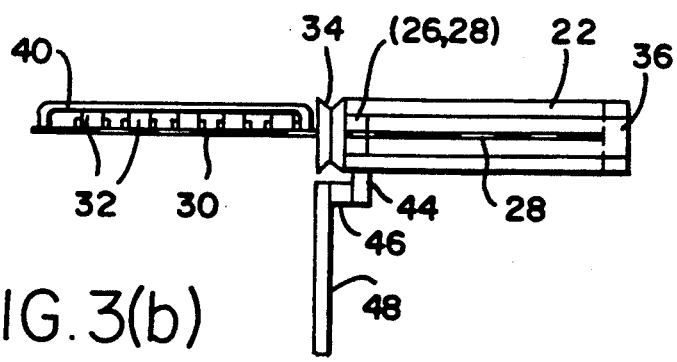

BURN-IN TESTING EQUIPMENT HAVING AN INSTRUMENTATION CONTROL MODULE

This application is a continuation of Ser. No. 263,219, filed on Oct. 27, 1988, abandoned.

FIELD OF THE INVENTION

The present invention relates to instruments for stress testing electronic components by exposing the same in a high temperature environment, and more specifically to the use of an instrumentation control module which can be manipulated by robotic control for carrying to-be-stress-tested electronic components into a high temperature oven.

BACKGROUND OF THE INVENTION

As was discussed in copending Application Ser. No. 263,453 entitled Stress Testing Equipment With An Integral Cooling Plenum by one of the inventors of the instant invention and assigned to the same assignee as the instant invention, and incorporated herein by reference, in stress testing electronic components in a high temperature environment, inasmuch as prior to the invention disclosed in the copending Application, connectors for mating a driver board and a carrier board are positioned either within, or adjacent to, the high temperature oven, metal fatigue of the contacts and degradation of the connector bodies oftentimes result. This in turn results in inaccurate measurements.

In the copending Application, it was disclosed that by using a moderate temperature section (an integral cooling plenum) and by extending the carrier card into the moderate temperature section, with the connectors being built into the interface junction between the moderate temperature section and an ambient temperature section, the connectors are protected from the heat in the high temperature oven. Moreover, to insure that no heat would escape from the high temperature oven into the moderate temperature section, a sealer gasket is placed at the junction of the high temperature oven and the moderate temperature section. Also, by means of cool air circulating within the moderate temperature section, any heat that may be produced by convection is carried away, so that only a moderate temperature, in the form of a temperature gradient, exists in the moderate temperature section.

The device of the copending Application works well, as long as there is an integral cooling planum in the device. Oftentimes, however, such cooling planum are not feasible, or indeed, are not desirable. In such situations, it then becomes imperative that a different kind of apparatus be used which would both allow the stress testing of electronic components and insure that the connectors, if any, connecting a driver board to a carrier board would not be exposed to a high temperature environment.

SUMMARY OF THE PRESENT INVENTION

To resolve the aforenoted problems, the present invention testing equipment uses an instrumentation control module which has an enclosure for containing a driver card, and the necessary connectors, for mating with a carrier card which has mounted thereon the electronic or electrical components which are to be stress tested in a high temperature environment. To prevent heat in the high temperature environment oven from escaping into the enclosure of the module, a sealer gasket is placed at the end of the enclosure where the carrier card is mated to the connectors in the enclosure, and encircles the carrier card. Thus, when the module is transported toward a high temperature environment such as that in an oven, and when the carrier card is completely inserted through a slot (or aperture) in an interface barrier separating the high temperature oven from the section where the module is being transported, the sealer gasket would then become intimately engaged with the area surrounding the slot in the barrier, thereby preventing heat in the high temperature oven from escaping into either the enclosure of the module or the section through which the module has just been transported.

To maintain the temperature within the enclosure of the module hospitable, a fan, located somewhere on the enclosure, circulates cool air into and out of the enclosure. Consequently, since the connectors are located within the enclosure and heat is prevented from entering the enclosure, the connectors are not exposed to high temperature heat. Furthermore, any heat due to convection is carried away by the circulating cool air.

The instrumentation control module is constructed such that it may be handled by robots, thereby eliminating interfacing which were necessary in the prior art burn-in testing equipment. So, too, the module, more specifically the enclosure, can be integrated with a programmable display so that the module itself can be taken out of the testing equipment and the status of the electronic components, as well as the interactions between the components and the electronic circuits on the driver card, can be ascertained outside of the testing equipment. Of course, either one of the driver or the carrier cards can thus be replaced with ease.

It is, therefore, an objective of the present invention to provide for an instrumentation control module which will eliminate the need for an integral cooling plenum in a testing equipment.

It is another objective of the present invention to provide for an instrumentation control module which can be transported by robots, such that a carrier card containing the electronic components to be stress tested and extending from the control module, may be inserted into a high temperature oven, without the temperature in the enclosure of the module being affected.

It is yet a further objective of the present invention to provide for an instrumentation control module that can be taken out of the stress testing equipment and be read independently by a technician.

The above-mentioned objectives and advantages of the present invention will become more apparent and the invention itself will be best understood with reference to the following description of the invention taken in conjunction with the accompanying drawings, wherein:

BRIEF DESCRIPTION OF THE DRAWINGS

FIG. 1 is a plan view of the overall testing equipment of the instant invention;

FIG. 2a is a plan view of an isolated instrumentation control module of the present invention;

FIG. 2b is a cross sectional view of the FIG. 2a module;

FIG. 3a is a perspective view of an instant invention control module;

FIG. 3b is a side view of the FIG. 3a control module, with a power board connected thereto; and FIG. 4 is a partial view of the back of the enclosure of the FIG. 3a control module.

DETAILED DESCRIPTION OF THE PRESENT INVENTION

FIG. 1 shows, in a plan view, the present invention stress testing equipment. As shown, the present invention equipment 2 has a high temperature chamber (or an oven) 4 which is separated from an adjacent transfer section (or area) 6, which has a temperature much lower than that in oven 4, by an interface barrier wall 8. Although not a major part of the present invention equipment, a storage area 10 is located next to transfer section 6, and opposite to oven 4.

For the FIG. 1 embodiment, it can be seen that four instrumentation control modules 12a to 12d are located within the equipment, with respective portions of modules 12a and 12b being inserted into oven 4. At the same time, modules 12c and 12d are held by robots 14a and 14b, respectively. Module 12c is seen to remain entirely within transfer section 6; while module 12d is shown to be stored in storage area 10.

As should readily be appreciated, robots 14a and 14b are conventional types of robots with similarly conventional software, and are under the command of a processor (not shown). In essence, robots 14a and 14b both can move in a longitudinal direction along the length of transfer section 6, as indicated by directional arrows 16. Also, the robots can move in directions which are transverse to those represented by directional arrow 16, in other words, into and out of the paper containing FIG. 1. Accordingly, even though modules 12a and 12b are shown to be inserted into oven 4 through slots or apertures 18a and 18b, respectively, in actuality, there is a plurality of slots similar to 18a and 18b running up and down along oven wall 8. Likewise, although only module 12d is shown to be stored in storage area 10, in actuality, a plurality of control modules may also be stored within area 10 in a direction transverse to directional arrows 16.

To remove one of the control modules from storage area 10, the corresponding robot, using its hand, for instance hand 20a for robot 14a and 20b for robot 14b, can seize a corresponding control module, and either rotating in a direction transverse to the directional arrows 16 or per directional arrows 16, would transport the same toward oven 4.

With reference to FIGS. 2 and 3, the particular structure of an instrumentation control module of the present invention is given hereinbelow.

A control module, for example 12a, is shown to have an enclosure or casing 22, one end of which is opened and fitted with connectors 24 and 26. These connectors may be AMP-HDI type connectors from the AMP Corporation, located in Pennsylvania. These connectors are engaged to each other, with metallic contacts of connector 24 being jointed to those of connector 26.

A carrier card 28, which has either mounted thereon or integrated thereto electronics including driver electronic circuits, is mated to connector 24; while a carrier card 30 having mounted thereto a plurality of integrated circuit (IC) components 32, is mated to connector 26. Consequently, driver board 28, in essence, is mated to carrier board 30. At the opening of enclosure 22 a sealing gasket 34 is attached. The sealing gasket is a conventional silicone rubber gasket whose purpose will be discussed later. To the back of enclosure 22 is an opening, fitted with a circulating means such as a DC fan 36.

Although shown as being uncovered, in practice enclosure 22 has a top cover (and/or a bottom cover) which, but for a small portion between connector 24 and dotted line 38, covers the entire top (and/or bottom) of enclosure 22. Thus, air drawn in by fan 36 would circulate throughout enclosure 22 and exit through the opening between line 38 and connector 24. The reason for the need of this circulating air will be discussed.

Shown in FIGS. 2 and 3 as being mounted onto carrier board 30 is a rod 40 which protrudes upward from the surface of carrier board 30. For the sake of simplistic illustration, it should be appreciated that driver board 28 is not drawn in FIG. 3a.

FIG. 2b shows, in a cross-sectional view of the control module, that because of sealing gasket 34 and carrier board 30, the opening to enclosure 22 is blocked.

Returning to FIG. 1, the instant invention control module, as demonstrated by module 12a, is mated with oven 4 by having carrier card inserted into the same, through aperture 18a. For this embodiment, although not shown, a trap door is placed at the surface of wall 8, designated as 42. When module 12a is inserted into oven 4, rod 40 (See FIG. 3) maintains the trap door above the electronic components, so that the latter will not be damaged by the former. And since gasket 34 forms a tight seal with surface 42, and since the opening of enclosure 22 is blocked by a combination of seal gasket 34 and carrier card 30, no heat from high temperature oven 4 could escape into enclosure 22 or transfer section 6.

To keep the area within enclosure 22 at an ambient or hospitable temperature, as mentioned previously, cool air is circulated therethrough by means of fan 36. In view of the ambient temperature in which driver card 28 and connectors 24 and 26 are located, the connectors are not exposed to any high temperature environment. Thus, no degradation of the connectors, nor contact fatigue, occurs. In the meantime, the electronic components which are mounted onto carrier card 30 are being stress tested in a high temperature environment in oven 4, the signals for activating the components being generated from the electronic circuits on driver card 28.

With reference to FIG. 3b, it can be seen that the power needed for operating driver card 28 is supplied, by means of a matching set of connectors 44 and 46, which are mounted respectively to enclosure 22 and a power card (or an electrical lead) 48.

More fully disclosed in a yet to be filed copending Application by one of the inventors of the instant invention is a programmable LCD bar code display 50, shown in FIG. 4. Briefly, the function of bar code display 50 is to allow a technician to indirectly address and retrieve data from a particular board which had been tested earlier.

Although a separate carrier card and driver card has been disclosed so far, it should be appreciated that instead of two cards, a single card containing two portions, one of which has mounted thereon the electronics for driving the to-be-tested electronic components and a second portion having mounted thereon the electronic components may also be used. In this instance of using only one board with two separate portions, no connectors are needed. Such an embodiment is foreseen for high speed circuits which operation, if connectors are used, would be degraded.

In view of the cool circulating air drawn into the enclosure by the built-in fan, no problem is foreseen with respect to any over heating of the electronic circuits on the portion of the board residing inside the enclosure, as any heat generated by convection will be carried away by the circulating air.

Insofar as the present invention is subject to many variations, modifications and changes in detail, it is intended that all matter described throughout this specification and shown in the accompanying drawings be interpreted as illustrative only and not in a limiting sense. Accordingly, it is intended that the invention be limited only by the spirit and scope of the appended claims.

We claim:

1. A method of stress testing electronic components, comprising steps of:
   - automatically removing a module containing to be tested electronic components from a storage area, the module including:
     - a carrier card carrying thereon said electronic components;
     - a driver card containing driver electronics for generating signals to activate said electronic components; and
     - an enclosure for substantially enveloping said driver card;
   - automatically moving said module across an ambient temperature transfer area;
   - automatically inserting said carrier card of said module through an opening of a barrier into a high temperature section separated by said barrier from said transfer area for testing said electronic components;
   - wherein said removing, moving and inserting steps are all performed absent human intervention;
   - withdrawing said module away from said high temperature section; and
   - reading data related to said electronic components having been stress tested in said high temperature section from a display means integrated to said enclosure of said module.

2. System for stress testing electronic components, comprising:
   - at least one high temperature section;
   - a transfer section having a first end separated from said high temperature section by an interface barrier;
   - a storage section adjacent to a second end of said transfer section;
   - at least one module including:
     - a carrier card carrying thereon to-be-stress-tested electronic components;
     - a driver card containing electronic circuits for generating signals to activate said electronic components carried on said carrier card;
     - an enclosure for housing said driver card and for providing easy handling and movement of said module;
     - connecting means positioned within one end of said enclosure for mating said carrier card to said driver card;
     - seal means positioned outside of said enclosure and encircling a portion of said carrier card for isolating said connecting means from the environment to which said carrier card is exposed;
   - means for grasping said module by said enclosure and moving said module from said storage section adjacent to said transfer section and adjacent to said high temperature section, said grasping and moving means further guiding said carrier card into said high temperature section through a slot in said interface barrier, said enclosure remaining in said adjacent transfer section for effectively urging said seal means against the area of said interface barrier surrounding said slot to substantially prevent heat within said high temperature section from escaping into said transfer section or said enclosure and shield said connecting means from being exposed to the heat from said high temperature section.

3. System according to claim 2, further comprising:
   means integrated to said enclosure for circulating cool air into said enclosure to maintain an ambient temperature environment within the enclosure.

4. System according to claim 2, wherein said connecting means comprises:
   at least one pair of jointed connectors one of which is mated to said carrier card and the other of which is mated to said driver card.

5. System according to claim 2, wherein said seal means comprises a silicone rubber gasket.

6. System according to claim 2, further comprising:
   display means integrated into said enclosure for outputting information relating to said electronic components having been stress tested in said high temperature section.

7. System according to claim 2, wherein said interface barrier has a trap door over said slot for preventing heat in said high temperature section from escaping into said transfer section when said module has not been moved adjacent to said high temperature section; and
   wherein said carrier card has means extending therealong for keeping said trap door open when the said carrier card is being inserted into said high temperature section.

8. System according to claim 2, wherein said enclosure comprises:
   means for coupling to a power source to obtain power therefrom to operate said electronic circuits to drive said electronic components during stress testing of the same.

9. System for stress testing electronic components, comprising:
   - at least one high temperature chamber;
   - a storage chamber;
   - an ambient temperature chamber sandwiched between said storage chamber and said high temperature chamber, and separated from said high temperature chamber by a barrier having at least one opening;
   - at least one module movable in said storage and ambient temperature chambers, wherein said module comprises:
     - an enclosure;
     - card means having a first portion located within said enclosure and a second portion extending out of an open end of said enclosure, said second portion having mounted thereto electronic components to be stress tested and said first portion having mounted thereto electronic circuits for generating signals to drive said electronic components;
     - seal means encircling said card means at the open end of said enclosure;
   - means for automatically retrieving said module from said storage chamber by grasping said enclosure and maneuvering said enclosure across said ambient temperature chamber against said barrier to intimately urge said seal means to the area surrounding said opening in said barrier and to insert said second portion of said card means into said high temperature chamber for stress testing said electronic components;

whereby said seal means prevents heat in said high temperature chamber from escaping into said enclosure or said ambient temperature section.

10. System according to claim 9, further comprising:
means integrated to said enclosure for circulating cool air therein to maintain an ambient temperature environment within said enclosure.

11. System according to claim 9, wherein said seal means comprises a silicone rubber gasket.

12. System according to claim 9, further comprising:
display means integrated to said enclosure for providing information relating to said electronic components having been stress tested in said high temperature chamber.

13. System according to claim 9, wherein said enclosure comprises:
means for coupling to a power source to obtain power therefrom to operate said electronic circuits to drive electronic components during stress testing of the same.

14. System according to claim 9, wherein said card means comprises at least two cards one corresponding to said first portion and the other corresponding to said second portion.

15. System for stress testing electronic components, comprising:
at least one storage chamber;
at least one high temperature chamber;
a section sandwiched between said storage chamber and said high temperature chamber, said section separated from said high temperature chamber by a barrier;
at least one module including an enclosure containing a driver card mated to a carrier card at one end of said enclosure, said driver card carrying thereon to-be-stress-tested electronic components, said driver card having means thereon for generating signals to drive said electronic components during stress testing of the same;
robot means located within said section for grasping and positioning said enclosure, and thereby transporting said module towards said barrier until said carrier card carrying the electronic components is inserted into said high temperature chamber through an aperture in said barrier;
wherein said module further includes seal means encircling the portion of said carrier card outside the end of said enclosure where said driver card is mated to said carrier card for intimately sealing the area surrounding said aperture in said barrier when said enclosure of said module is positioned by said robot means such that said one end of said enclosure is pushed against said barrier when said carried cards is inserted into said high temperature chamber to prevent heat in said high temperature chamber from escaping into either said module or said section.

16. System according to claim 15, wherein said driver card is mated to said carrier card via a pair of jointed connectors one of which is mated to said driver card and the other of which is mated to said carrier card.

* * * * *